United States Patent [19]

Troxel

[11] Patent Number: 4,806,879
[45] Date of Patent: Feb. 21, 1989

[54] METHOD AND APPARATUS FOR SYNCHRONIZING TO A PULSE TRAIN PACKET SIGNAL

[75] Inventor: Donald E. Troxel, Belmont, Mass.

[73] Assignee: ECRM Incorporated, Tewksbury, Mass.

[21] Appl. No.: 44,982

[22] Filed: May 1, 1987

[51] Int. Cl.$^4$ ............................................. H03L 7/00
[52] U.S. Cl. ........................................................ 331/2
[58] Field of Search ...................... 331/1 A, 2, 18, 25; 369/59; 360/39; 250/237 G; 375/120

[56] References Cited

U.S. PATENT DOCUMENTS

| | | | |
|---|---|---|---|
| 4,067,021 | 1/1978 | Baylis et al. | 346/76 L |
| 4,080,634 | 3/1978 | Schreiber | 358/298 |
| 4,131,861 | 12/1978 | Malaviya | 331/2 |
| 4,203,672 | 5/1980 | Smith | 356/431 |
| 4,233,636 | 11/1980 | Harbaugh et al. | 358/287 |
| 4,365,211 | 12/1982 | Lee | 331/11 |
| 4,459,560 | 7/1984 | Kurihara | 331/2 |
| 4,566,091 | 1/1986 | Gerard et al. | 369/47 |
| 4,566,092 | 1/1986 | Gerard et al. | 369/59 |

Primary Examiner—Eugene R. LaRoche
Assistant Examiner—Robert J. Pascal
Attorney, Agent, or Firm—Hale and Dorr

[57] ABSTRACT

An apparatus and method for synchronizing to a scanning galvanometer system provide for magnification changes on the order of one part in a thousand. The apparatus employs two phase locked loops connected in series with a digital counter divider. The combination of phase locked loop, digital divider, and phase locked loop provide a multiplication factor equal to a*c/b which enables the required precision in magnification step change to be achieved. Critical to operation of the circuitry is the provision for resetting the divider counter when the first phase locked loop is sufficiently synchronized to a ruled grating which is part of the scanning system.

15 Claims, 3 Drawing Sheets

METHOD AND APPARATUS FOR SYNCHRONIZING TO A PULSE TRAIN PACKET SIGNAL

BACKGROUND OF THE INVENTION

The invention relates generally to a method and apparatus for synchronizing to pulse generating circuitry, and in particular, to a method and apparatus for synchronizing a high frequency pulse generating circuitry to packets of lower frequency pulse signals derived from a scanning system which traverses a ruled grating.

In one high precision scanning system, a scanning galvanometer traverses a beam provided from a laser source across an object to be scanned. Simultaneously, the laser-generated energy beam scans across a ruled grating to provide accurate positioning information for the scanning system. In a typical system, the ruled grating provides substantially coarser position markings (typically eighty line pairs per inch) than required by, for example, a precision recording and reading system. Since the coarse grating provides insufficient precision for the system, the scanning apparatus synchronizes a higher frequency pulse train to the grating derived pulse train and outputs a second pulse train which can have, for example, 100 or more pulses between each of the ruled grating derived pulses.

As the scanning equipment becomes more sophisticated and precise, it is desirable to provide yet greater performance precision for the system. For example, the system can be employed to effectively magnify a section of the region being scanned, and in this mode of operation it is desirable to effect changes in system magnification of one part in a thousand. In order to achieve this precision, it is necessary to output, based upon the ruled grating markings, a pulse train which can be varied by one part in a thousand.

This presents a substantial difficulty to a standard synchronization system which typically operates in a phase locked loop configuration. The problem results first from the nonperiodicity of the pulse train (the scanning beam moves fastest at the middle of its scan and has the greatest rate of change at the end of the scan) and second, because of the large dynamic range required for implementing the standard phase locked loop configuration to achieve a 0.1 percent precision. Accordingly, the standard phase locked loop would need to operate at a 20 megahertz frequency rate, a rate which would require not only specialized and precision components, but one which is practically unavailable with present day technology. If available, the cost of the system for a typical scanning galvanometer controlled apparatus, such as that used in a document reading and recording, would be prohibitive.

The scanning problem is further exacerbated by the requirement, when writing or reading a scanned document, for starting the generation or collection of data at the same sample position along each scan line. If this is not done, and it is especially objectionable in a written document, there results an initial ragged edge and a resulting lack of synchronization from line to line of the scanned material. This important requirement is further complicated by the varying scanning velocity of the galvanometer along its scan path (resulting in a change in the time duration between pairs of grating lines along the ruled grating) and the desire to "magnify" different portions of a scanned document or to write different sized documents using different "magnifications."

It is therefore a primary object of the invention to provide an economical, simple, reliable, and repeatable synchronization apparatus and method which provide a 0.1 percent step size in scanning magnification and a high repeatability of scan starting location. Other objects of the invention are a scanning apparatus and method which can be constructed using standard circuit components.

SUMMARY OF THE INVENTION

The invention relates to a method and apparatus for generating a first pulse sequence synchronized to a time-limited second pulse sequence. The second pulse sequence has a variable pulse repetition rate (designated DG) which is less than a desired pulse repetition rate for the first sequence. The apparatus features a first phase locked loop for synchronizing to the second pulse sequence and for providing an output signal having a pulse repetition rate equal to $DG*a$; a divider circuitry responsive to the output signal for providing a divider output signal having a pulse repetition rate equal to $DG*a/b$, and a second phase locked loop for synchronizing to the divider output signal for providing a final output signal having a pulse repetition rate equal to $DG*a*c/b$. The parameters "a", "b" and "c" are positive integers. The apparatus further features circuitry for setting a counter of the divider circuitry to a selective counter value and a control circuitry for enabling the setting circuitry when the first phase locked loop is sufficiently synchronized to the second pulse sequence.

The apparatus is particularly useful in a scanning system having a ruled grating, a scanner for scanning the grating for generating a grating signal, and circuitry responsive to the grating signal for generating the second pulse signal.

In a particular aspect of the invention, the second pulse signal contains a plurality of packets of pulse signals, the packets being spaced in time from each other and the pulses associated with one packet representing a traverse of the ruled grating. The apparatus further features circuitry for providing a simulation pulse sequence to the first phase locked loop, the simulation pulse sequence having a pulse repetition rate approximately equal to the pulse repetition rate of pulses at the ends of the packets (corresponding to the beginning and end of the galvanometer scan) and the simulation sequence being input to the first phase locked loop at those times when the packets of pulses are unavailable.

In yet another aspect of the invention, the control circuitry features counter circuitry for counting pulses in each packet of the second pulse sequence and circuitry responsive to the counter circuitry for declaring the sufficient synchronization to the second pulse sequence each time a preselected number of pulses in a packet has been counted. Preferably, the setting circuitry resets the divider circuitry to a zero count when the first phase locked loop is sufficiently synchronized. In this manner, the parameters "a", "b", and "c" enable changes of the magnification quantity $a*c/b$ on the order of one part in one thousand.

In another aspect of the invention, the method features the steps of synchronizing an output signal to the second pulse sequence, the output signal having a pulse repetition rate equal to $DG*a$, dividing the pulse repetition rate of the output signal for providing a divider output signal having a pulse repetition rate equal to DG*a/b, and then synchronizing a final output signal to the divider output signal for providing the final output signal having a pulse repetition rate equal to DG*a*c/b. The method further features setting, in the dividing step, a divisor count equal to a selected counter value and initiating the setting step when the first synchronizing step provides sufficient synchronization to the second pulse sequence.

In a preferred embodiment, the second pulse signal is characterized by the repeating packets of pulse signals, the packets occurring spaced in time from each other. The method further features providing a simulation pulse sequence, the simulation sequence having a pulse repetition rate approximately equal to the pulse repetition rate of pulses at the ends of a packet and synchronizing to the simulation sequence during times when the packets are unavailable.

The method further, in another aspect of the invention, has the steps of counting pulses of each packet of pulse signals, and in response to the pulse count, declaring a condition of sufficient synchronization to a packet of the second pulse sequence when a preselected number of pulses of the pulse sequence packet has been counted. Further, in this embodiment, the method features resetting the divisor count to a zero count when the first synchronizing step reaches the condition of sufficient synchronization.

BRIEF DESCRIPTION OF THE DRAWINGS

Other objects, features, and advantages of the invention will be apparent from the following description taken together with the drawings in which.

DESCRIPTION OF A PREFERRED EMBODIMENT

Figure 1:
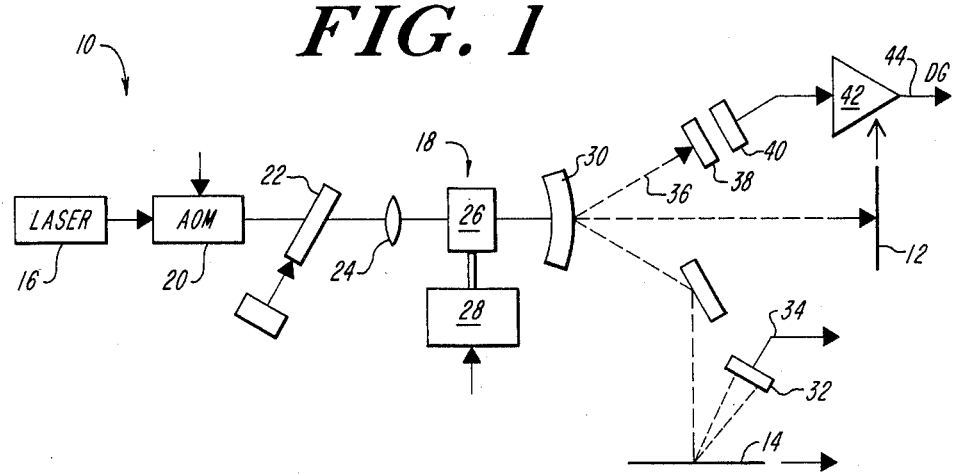
FIG. 1 is a block diagram representation of the scanning system in accordance with a preferred embodiment of the invention.

Referring to FIG. 1, the invention relates to a scanning system 10 for effecting precision recording on and reading from scanned documents 12, 14, respectively using a laser source 16 and a scanning galvanometer system 18. A particular implementation of a scanning system including both the reading and recording modes of operation, is described in Schreiber, U.S. Pat. No. 4,080,634, assigned to the assignee of this invention. The disclosure in the Schreiber patent is incorporated herein, in its entirety, by reference.

The output of the laser 16 passes through an acousto-optical modulator 20, a rotating shutter system 22, and then through a lens 24 to the scanning galvanometer system 18. The scanning galvanometer system has a single deflecting galvanometer mirror 26 driven by a galvanometer drive device 28. The output from the deflecting galvanometer mirror 26 passes through an objective lens 30.

Depending upon the mode of operation, a beam of energy is directed either for recording on document 12 or reading from a document 14. When focused energy is scanned across document 14, energy reflected from the document is sensed by a photosensitive device 32, the output of which, over a line 34, provides the data representative of the material being read. In both the record and read modes of operation, a light beam 36 is directed to a ruled digital grating 38. The energy passing through the grating is detected by a photodetector 40. The electrical output of photodetector 40 is amplified by a preamplifier 42 to provide a digital grating signal over lines 44.

The system 10 is a typical scanning system and is described in much greater detail in the above identified Schreiber patent.

Figure 2:
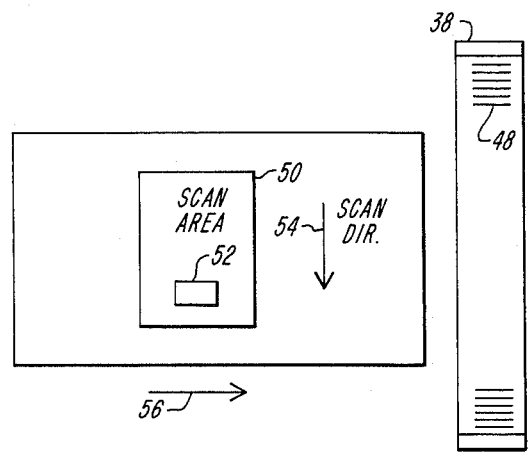
FIG. 2 is a representation showing the digital ruled grating and the scanning plane in accordance with a preferred embodiment of the invention.

According to the illustrated embodiment of the invention, the digital grating has markings 48 spaced approximately 0.0125 inches apart. This spacing, however, is much too coarse for the sampling requirements of the system which must have the capability of providing sample points at least 25 times finer. In addition, referring to FIG. 2, it is also necessary when reading or recording a document 50, to be able to read or record a limited section of that document such as area 52 at a high sampling rate. When this region is played back at a "normal" sampling rate, substantial magnification can be achieved. The system is restricted, however, since the reading or recording operation must begin at the same location on the document at each scan to provide a straight, rather than jagged, leading edge. As noted in the illustrated embodiment, the scan direction of the galvanometer, corresponding to the arrow 54, is normal to the direction of movement, indicated by arrow 56, of the material to be read or recorded.

Figure 3:
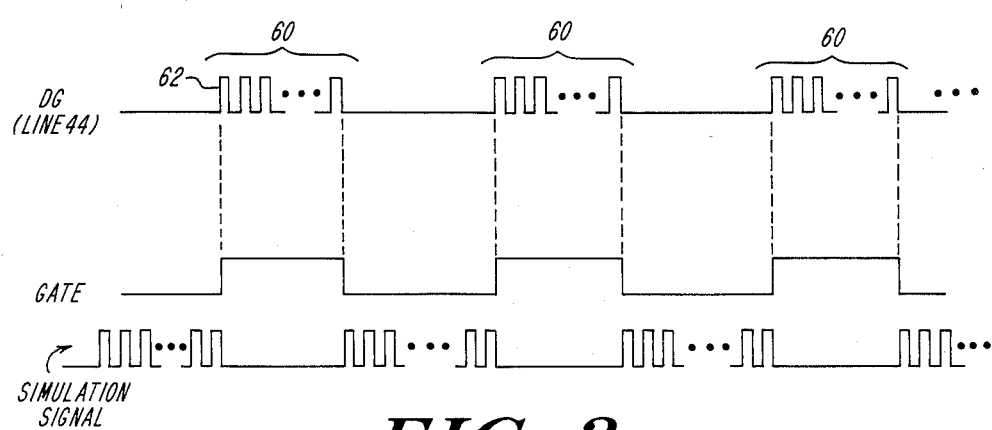
FIG. 3 is a timing diagram of some electrical signals according to a preferred embodiment of the invention.

Accordingly, therefore, referring now to FIG. 3, the output of the preamplifier 42, representing the signals from the digital grating 38, as detected by photodetector 40, are packets 60 of pulse signals separated in time in accordance with the time required for the energy beam to begin its next scan. In the illustrated embodiment of the invention, one movement direction of the scanning energy beam is used for recording a document and the other movement direction of the energy beam is used for reading a document. Further, in the illustrated embodiment of the invention, scanning is performed continuously, line by line so that the packets of pulses 60 have a periodic occurrence. In other embodiments of the invention of the packets need not be periodically spaced.

The pulses 62 within a packet, each pulse corresponding to a mark on the ruled digital grating, will appear at an instantaneous pulse repetition rate "DG." The rate at which the pulses occur is not uniform or periodic due to the nature of the scanning galvanometer, and the pulse repetition rate DG of the pulses 62 is greatest near the center of the scan, which corresponds to the center of the packet, and is least and changes at the greatest rate at the ends of the packet. Thus, a system which synchronizes to the grating pulses must accommodate this change in pulse repetition rate.

Figure 4:
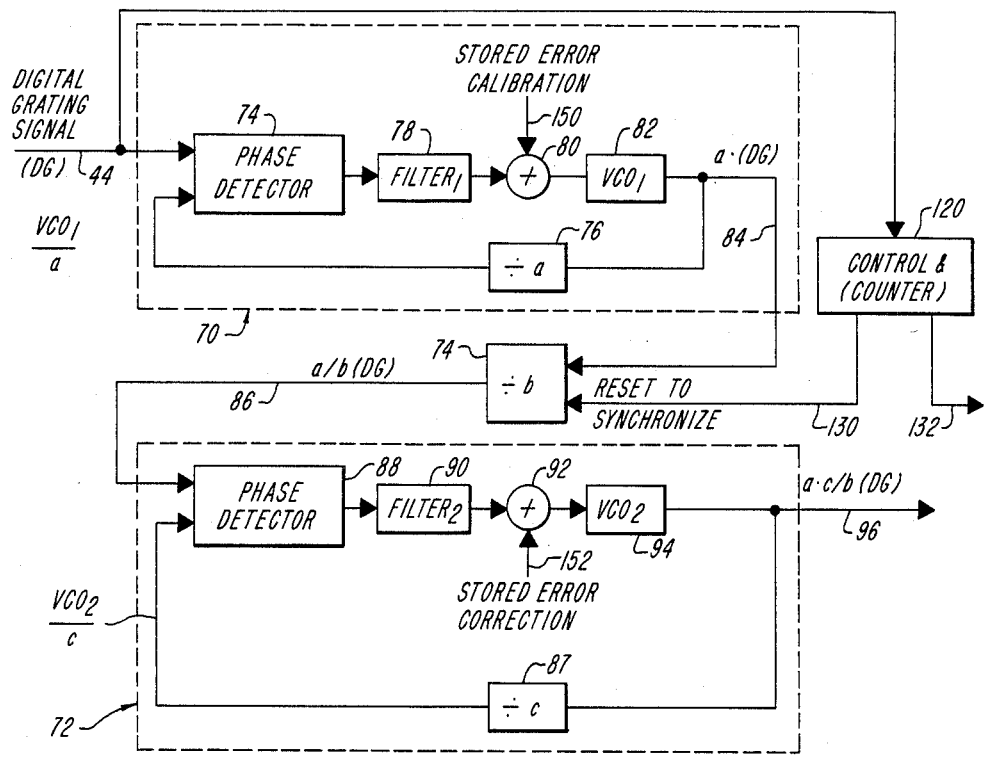
FIG. 4 is an electrical block diagram of the multiple loop synchronization system in accordance with one embodiment of the invention.

Referring to FIG. 4, the apparatus for generating a synchronized pulse signal at the higher sampling frequency has a first phase locked loop 70, a second phase locked loop 72, and a digital divider 74 which connects the output of the first phase locked loop and the input of the second phase locked loop. The function of the two phase locked loops is substantially identical and standard. In the operation of the first phase locked loop, the input signal, the digital grating signal from preamplifier 42, is directed to a phase detector 74 which also receives as an input the output of a divide by "a" counter 76. The output of the phase detector is filtered by a filter 78, the output of which passes to an adder circuitry 80 to be described hereinafter. The output of the adder circuitry, which is the output of filter 78 and a stored error calibration signal to be described hereinafter, is directed to a voltage controlled oscillator 82. The output of the oscillator, when synchronization has been achieved, is a pulse signal having a pulse repetition rate equal to "a" times the pulse repetition rate of the input digital signal, written "DG*a".

This pulse output signal appears over a line 84. The output of the first phase locked loop passes through the divider circuitry 74 built, for example, around a divider counter as is well known in the art. The divider circuitry 74 effectively divides the pulse rate input to it by an integer "b" and directs its resulting pulse output to the second phase locked loop 72 over a line 86. The second phase locked loop, having the same configuration as the first phase locked loop, phase detects the output of the divider 71 relative to the output of its internal, divide by "c", divider 87 using a phase detector 88. The output of the phase detector 88 is filtered by a filter circuitry 90, and the output of the filter circuitry passes to an adder 92 where it is added to a stored error correction signal as described hereinafter. The output of the adder 92 is directed to a second voltage controlled oscillator 94 whose output over a line 96 is a pulse signal having a pulse repetition rate equal to that of the original digital grating signal multiplied by a factor equal to "a" times "c" divided by "b" (written "DG*a*c/b").

If the digital grating signal over line 44 were a continuous signal, the "solution" to the problem of providing the necessary output signal over line 96 would end here. However, as noted above, the digital grating signal is not continuous, and in fact, comprises packets of pulses separated from each other in time. In addition, the system has the requirement that actual scanning begin at the same relative picture element location for every scan line, that is, for each packet of pulses derived from the digital grating signal.

To meet these conditions, therefore, the apparatus further generates a simulated digital grating signal (the "simulation" signal) which is available at those times when packets 60 of pulse signals from the grating are not available. The system further, according to the illustrated embodiment of the invention, provides an advantageous synchronization method and apparatus to ensure that scanning of a scan area is initiated at the same picture element location, in the scanning direction, for each scan line.

Figure 5:
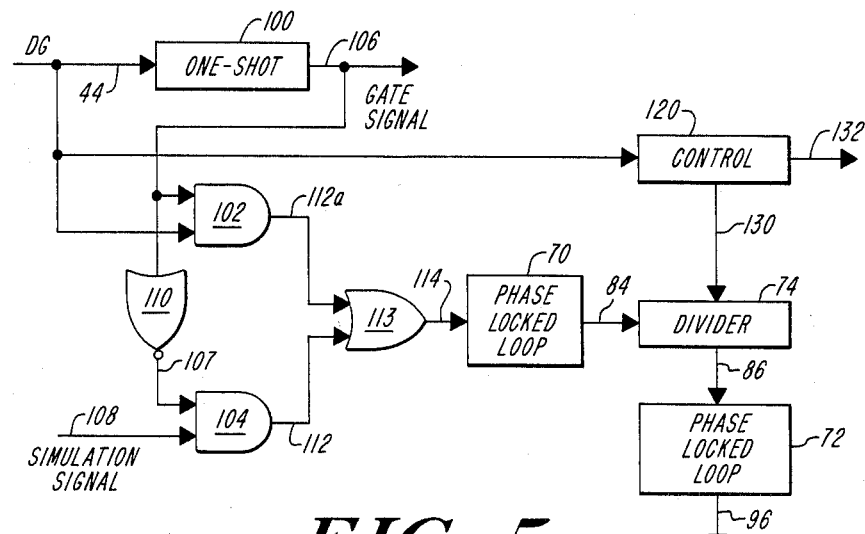
FIG. 5 is of an electrical block diagram of a multiple loop system according to a preferred embodiment of the invention.

Referring to FIG. 5 therefore, the digital grating signal over line 44 is preferably directed to both a retriggerable one-shot multivibrator 100 and to a multiplexing circuitry consisting of AND gates 102 and 104. The output of the one-shot multivibrator 100, over a line 106, is a gate signal which is high when the digital grating signal is present and low otherwise. The gate signal, and its inverse over a line 107, are applied to AND gates 102 and 104 to provide to the synchronization circuitry, alternatively, the digital grating signal over line 44 and a simulation signal over a line 108. The simulation signal over line 108 is preferably a periodic pulse signal having a pulse repetition rate approximately equal to the pulse repetition rate of the pulses at the ends of the packets 60 of the digital grating signal and preferably in phase with the grating signal. The inverted gate signal is provided by passing the signal over line 106 through an inverter 110.

The gated simulation signal output of gate 104, over a line 112, is illustrated in FIG. 3. The digital grating signal over line 44 appears at the output of gate 102 over a line 112a. The output of gates 102 and 104 are OR'd together in an OR gate 113 to generate a new periodic pulse signal over a line 114 for phase locked loop 70, and replaces the digital grating signal over line 44 as the input to the phase locked loop (FIG. 4). In this manner, phase locked loop 70 tracks a continuous pulse signal having approximately the same average pulse repetition rate as the digital grating signal, and hence loop 70 need not initiate tracking of the packets 60 from, in essence, a standing start.

The two separate phase locked loops 70 and 72, according to the invention, are synchronized separately to their respective input signals. And, in accordance with the illustrated operation of the invention, it is after the first phase locked loop is synchronized to the digital grating signal to a sufficient precision that attention turns to synchronizing the second phase locked loop 72 to the output of divider 74. In this process, it is important and necessary that after phase locked loop 70 is synchronized to the digital grating, the counter of divider 74 be set to a known and preselected count. Typically, the counter is reset to a "zero" count. Thereby, the phase locked loop 72 synchronizes to the same starting location at each traverse of the scanning galvanometer.

In accordance with the invention, therefore, a control circuitry 120 (FIGS. 4 and 5) determines when phase locked loop 70 has been substantially synchronized to the digital grating signal. In accordance with the illustrated embodiment of the invention, control circuitry 120 contains a counter circuitry for counting, for each packet, the number of digital grating pulses received. When a preselected number of grating pulses have been received for a packet, corresponding to a selected acquisition time, the control circuitry 120 provides a signal over a line 130 for resetting the counter of divider 74 to a zero count. Any other selected value could be used so long as it was the same value for each scan of a document. Thereafter, phase locked loop 72 synchronizes to the divider output of divider 74; and, after a selected number of digital grating pulses, the system is determined to be fully synchronized to the digital grating signal and the output over line 96 can be employed for generating recording or reading sampling signals. The failure to set divider 74 can result in a ragged scanning edge, that is, an edge which is randomly displaced by one or more picture elements from a nominal "ideal" edge. This is a visually undesirable effect for most applications where high precision is needed.

Figure 6:
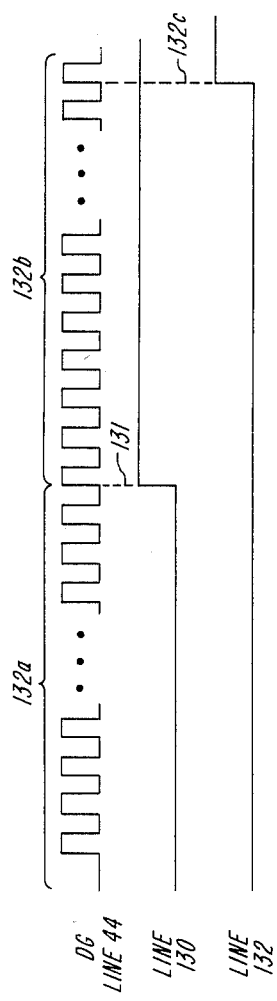
FIG. 6 is a timing diagram of some electrical signals according to a preferred embodiment of the invention.

Referring now to FIG. 6, the control circuitry 120 provides an output signal over line 130 at a time 131 for setting the divider count of divider 74 to a set value, in this illustrated embodiment "zero," when "sufficient synchronization" to the first loop 70 has occurred. The control circuitry 120 determines the sufficient synchronization of the first phase locked loop by counting the number of received digital grating pulses for a packet 60. A complete scan of the illustrated grating 38 provides 1102 pulses. The initial portion of the grating scan is used for synchronization purposes and, according to the invention, the circuitry 120 resets divider circuitry 74 when a group 132a, of thirty-eight digital grating pulses, has been detected. When the thirty-eight grating derived pulses have been received, at time 131, the output signal over line 130 is enabled and the counter of divider 74 is, in this illustrated embodiment, reset. Thereafter, a further group 132b of pulses from the digital grating is counted for a packet, and the control circuitry 120 then provides, at a time 132c, over a line 132, a sample enable signal which enables the sampling clock thereby providing for reading and/or recording of image data. The sampling frequency is determined by the pulse repetition rate of the output signal over line 96 from the second phase locked loop.

Figure 7:
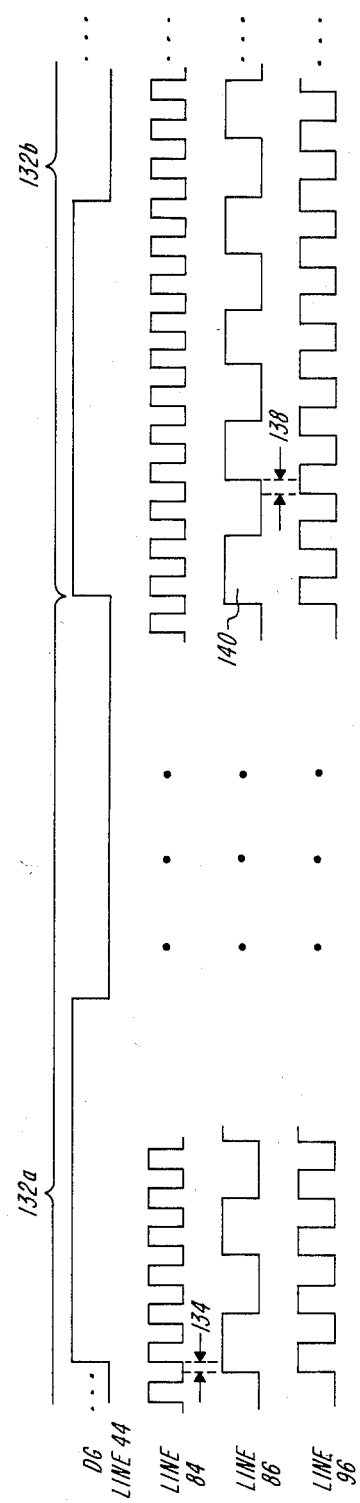
FIG. 7 is a timing diagram of further electrical signals according to a preferred embodiment of the invention.

Referring now to FIG. 7, at the time 131 when the first phase locked loop is sufficiently synchronized to the digital grating, the output signals over line 84, while having a higher pulse repetition rate than the digital grating, are synchronized to that grating signal as illustrated in FIG. 7. Similarly, the output signals from the divider 74 over line 86 will be synchronized in frequency to the input signal over line 84 since divider 74 is simply a divide by "b" circuitry, although there will typically be a phase delay offset 134 between the output of divider 74 and its input 84. This phase delay offset results from the length of time and the degree of phase mismatch under which phase locked loop 70 operates. The phase difference represented by the phase offset 134 thus occurs as a result of the synchronization process in loop 70 and the particular initial conditions under which the circuitry is initiated for synchronizing to a next incoming packet of digital grating pulses. As a result, the phase offset 134 can be considered a random value.

As noted above, in this illustrated embodiment, the count of divider 74 is reset upon the occurrence of the eighth digital grating pulse. When this pulse occurs, the output over line 84, as noted above, is expected to be synchronous with the digital grating pulses to within a desired degree of precision. When control circuitry 120 resets the counter of divider 74, it causes, in essence, a phase shift (indicated at 138) in the output signal of divider 74 (over line 86) which is illustrated in FIG. 7 by the additional width of pulse 140. The phase shift could also have resulted in a shortened spacing between two pulses. The second phase locked loop 72, whose output over line 96 was substantially in phase with the input signal over line 86, then has a time duration approximately equal to six digital grating pulses to acquire and synchronize to the now phase shifted output from divider 74 over line 86. This occurs with regularity and precision in accordance with the claimed invention, so that by the time the fourteenth grating pulse occurs, the synchronizing circuitry, composed of phase locked loops 70 and 72, in series connection with divider 74, enables sampling pulses to be accurately defined with respect to the digital grating with which it is and will remain synchronized.

In fact, the integers "a," "b," and "c" can be selected so that this circuitry can provide for a change in the quantity "a*c/b", for example, of one part in a thousand. In a particular embodiment, for example, the output of voltage controlled oscillator 82 can operate over a range of approximately 2,775–4,262 kilohertz, the output of voltage controlled oscillator 94 can operate over a range of approximately 1,266–1,945 kilohertz, the digital grating input signal, when digital grating pulses are present, has a range of pulse repetition frequency over a scan of between approximately 12.5–19.2 kilohertz, and the parameters a, b, and c can be, for example, 222, 206, and 94.

In this illustrated embodiment of the invention, as noted above, when the packets 60 of pulses are not present, the system provides a simulation pulse signal so that phase locked loops 70 and 72 are always synchronizing to a pulse signal having approximately the correct repetition rate and phase; and therefore, when the true digital grating signal over line 44 is applied to loop 70, the loop need only modify its operating point to a "modest" degree.

Further, in accordance with the illustrated embodiment of the invention, the apparatus provides a stored error calibration signal to loops 70 and 72 over lines 150 and 152, respectively. The error calibration signal reduces the required dynamic range of the phase locked loops. The calibration signals can be generated, sampled, and stored by operating the digital grating system in a closed loop configuration to determine what the error output of filters 78 and 90 would normally be. These analog error signals are stored, typically by sampling and digitizing the output signals of the filters, so that during subsequent synchronization of the loops to the digital grating, the normal outputs of filter 78 and 90 are generated on lines 150 and 152 respectively in synchronization with the digital grating pulses. The outputs of filters 78 and 90 then have an expected average value of "zero," adjusting only for random and noise error signals in the operation of the scanning galvanometer. This circuit configuration can also compensate for drift and other biasing effects (such as temperature and humidity) by periodically, during times when reading or recording is not being performed, re-acquiring the stored error calibration data. This technique is well known to those of average skill in the art and need not be described in any greater detail herein.

Additions, subtractions, deletions, and other modifications of the claimed invention will be apparent to those practiced in the art and are within the scope of the following claims.

What is claimed is:

1. Apparatus for generating a first pulse sequence synchronized to a time limited second pulse sequence, said second sequence having a varying pulse repetition rate, DG, less than a desired pulse repetition rate for the first sequence, said apparatus comprising a first phase locked loop for synchronizing to said second pulse sequence for providing an output signal having a pulse repetition rate equal to DG*a, a divider counter circuitry responsive to said output signal for providing a divider output signal having a pulse repetition rate equal to DG*a/b, a second phase locked loop for synchronizing to said divider output signal for providing a final output signal having a pulse repetition rate equal to DG*a*c/b, where "a," "b," and "c" are positive integers, means for setting said counter circuitry to a selected counter value, and control means for enabling said setting means when said first phase locked loop is sufficiently synchronized to said second pulse sequence.

2. The apparatus of claim 1 further comprising a ruled grating, a scanning system for scanning said grating for generating a grating signal, and means responsive to said grating signal for generating said second pulse sequence.

3. The apparatus of claim 1 further wherein said second pulse sequence is characterized by repeating packets of pulse signals, the packets being spaced in time from each other.

4. The apparatus of claim 3 further comprising means for providing a simulation pulse sequence to said first phase locked loop, said simulation sequence having a pulse repetition rate approximately equal to the average pulse repetition rate of pulse signals in a said packet, said simulation sequence being input to said first loop in the time spacings when said packets of pulses are unavailable.

5. The apparatus of claim 1 wherein said control means comprises counter means for counting pulses of said second pulse sequence, and means responsive to said counter means for declaring said sufficient synchronization to said second pulse sequence when a preselected number of pulses has been counted.

6. The apparatus of claim 5 wherein said setting means comprises means for resetting said divider circuitry to a zero count when said first phase locked loop is sufficiently synchronized.

7. The apparatus of claim 1 further comprising means for selecting the parameters "a," "b," and "c" for enabling changes of the quantity DG*a*c/b on the order of one part in one thousand.

8. Apparatus for generating a first pulse sequence synchronized to a time limited, second pulse sequence having a varying pulse repetition rate, DG, less than a desired pulse repetition rate for the first sequence, said apparatus comprising a ruled grating, a scanning galvanometer system for scanning said grating for generating a grating signal, means responsive to said grating signal for generating said second pulse sequence, a first phase locked loop for synchronizing to said second pulse sequence for providing an output signal having a pulse repetition rate equal to DG*a, means for inputting a simulation pulse sequence to said first phase locked loop in place of said second pulse sequence, said simulation sequence having a pulse repetition rate approximately equal to the average pulse repetition rate of pulses in a said second pulse sequence, said simulation sequence being input to said first loop when said second pulse sequence is unavailable, a divider counter circuitry responsive to said output signal for providing a divider output signal having a pulse repetition rate equal to DG*a/b, a second phase locked loop for synchronizing to said divider output signal for providing a final output signal having a pulse repetition rate equal to DG*a*c/b, where "a," "b," and "c" are positive integers, means for resetting said counter circuitry to a zero counter value, and control means for enabling said resetting means when a preselected number of pulses of said second pulse sequence has been counted, whereby said quantity a*c/b can be changed in 0.1% steps.

9. A method for generating a first pulse sequence synchronized to a time limited, second pulse sequence having a varying pulse repetition rate, DG, less than a desired pulse repetition rate for said first sequence, said method comprising the steps of synchronizing to said second pulse sequence for providing an output signal having a pulse repetition rate equal to DG*a, dividing said output signal for providing a divider output signal having a pulse repetition rate equal to DG*a/b, synchronizing to said divider output signal for providing a final output signal having a pulse repetition rate equal to DG*a*c/b, where "a," "b," and "c" are positive integers, setting, in said dividing step, a divisor count equal to a selected counter value, and initiating said setting step when said first synchronizing step provides sufficient synchronization to said second pulse sequence.

10. The method of claim 9 further wherein said second pulse sequence is characterized by a repeating packet of pulse signals, said packets occurring spaced in time from each other.

11. The method of claim 10 further comprising the steps of providing a simulation pulse sequence, said simulation sequence having a pulse repetition rate approximately equal to the average pulse repetition rate of pulses in a said packet, and synchronizing to said simulation sequence during the time spacings when said packets are unavailable.

12. The method of claim 9 wherein said initiating step comprises the steps of counting pulses of said second pulse sequence, and responding to said pulse count for declaring said sufficient synchronization to a said second pulse sequence when a preselected number of pulses of the second pulse sequence has been counted.

13. The method of claim 12 wherein said setting step comprises the step of resetting said divisor count to a zero count when said second pulse sequence synchronizing step reaches said sufficient synchronization.

14. The method of claim 9 further comprising the step of selecting the parameters "a," "b," and "c" for enabling changes of the quantity DG*a*c/b on the order of one part in one thousand.

15. A method for generating a first pulse sequence synchronized to a time limited, second pulse sequence having a varying pulse repetition rate, DG, less than the pulse repetition rate of said first sequence, and said second pulse sequence being characterized by repeating packets of pulse signals, said packets being spaced in time from each other, said method comprising the steps of synchronizing to said second pulse sequence for providing an output signal having a pulse repetition rate equal to DG*a, synchronizing to a simulation pulse sequence to provide said output signal during the time spacings when pulses from said second pulse sequence are unavailable, said simulation sequence having a pulse repetition rate approximately equal to the average pulse repetition rate of pulses in said second pulse sequence, dividing said output signal for providing a divider output signal having a pulse repetition rate equal to DG*a/b, synchronizing to said divider output signal for providing a final output signal having a pulse repetition rate equal to DG*a*c/b, where "a," "b," and "c" are positive integers, resetting, in said dividing step, a divisor count equal to a zero, and initiating said resetting step when a preselected number of pulses has been counted in said second pulse sequence, whereby said quantity a*c/b can be changed in 0.1% steps.

* * * * *